US006773870B2

(12) United States Patent
Lai et al.

(10) Patent No.: US 6,773,870 B2
(45) Date of Patent: Aug. 10, 2004

(54) PROCESS OF MANUFACTURING A DIFFUSIVE DIRECT REFLECTOR USING GRAY TONE EXPOSURE

(75) Inventors: Chih-Ming Lai, Hsinchu (TW); Yichun Wong, Tainan (TW); Chi-Chang Liao, Tainan (TW)

(73) Assignee: Industrial Technology Research Institute, Hsinchu (TW)

(*) Notice: Subject to any disclaimer, the term of this patent is extended or adjusted under 35 U.S.C. 154(b) by 126 days.

(21) Appl. No.: 10/140,252

(22) Filed: May 8, 2002

(65) Prior Publication Data

US 2003/0180628 A1 Sep. 25, 2003

(30) Foreign Application Priority Data

Mar. 22, 2002 (TW) .......................................... 91105554 A

(51) Int. Cl.[7] .................................................. G03C 5/00
(52) U.S. Cl. ...................................... 430/321; 430/396
(58) Field of Search .................................. 430/321, 396

(56) References Cited

U.S. PATENT DOCUMENTS 6,084,656 A * 7/2000 Choi et al. ..................... 355/71
6,163,405 A * 12/2000 Chang et al. ................ 359/599
2002/0163608 A1 * 11/2002 Ting et al. ................... 349/113
2003/0096198 A1 * 5/2003 Wong et al. ................. 430/321

FOREIGN PATENT DOCUMENTS

JP         2002-090511 A  *  3/2002

* cited by examiner

*Primary Examiner*—John A McPherson
(74) *Attorney, Agent, or Firm*—Birch, Stewart, Kolasch & Birch, LLP

(57) ABSTRACT

A process of manufacturing a diffusive direct reflector by Gray tone exposure. The process uses a controllable transmittance photomask on which the photomask pattern is formed by Gray tone exposure, the photomask pattern vertically divided into a plurality of regions, each having a plurality of micro transparent blocks and a plurality of micro dark blocks, so that a ratio of the plurality of micro transparent blocks's area to the total area of respective region has a feature of gradual change, so as to form a transmittance profile for controlling the transmittance profile and producing a desired structure on the diffusive direct reflector.

31 Claims, 11 Drawing Sheets

Form a photo resist layer on a substrate — S1

Expose the photo resist layer over a contrallable transmittance photomask by UV rays — S2

Develop on the photo resist layer exposed by UV rays to form a slanting photo resist layer — S3

Bake the slanting layer and coat a metal with high reflectivity over the slanting photo resist layer — S4

FIG. 11

PROCESS OF MANUFACTURING A DIFFUSIVE DIRECT REFLECTOR USING GRAY TONE EXPOSURE

BACKGROUND OF THE INVENTION

1. Field of the Invention

The present invention relates to a diffusive direct reflector manufacturing process, especially to a process of manufacturing diffusive direct reflector by Gray tone exposure, which uses a controllable transmittance Gray tone mask to produce the desired slant changes on a photoresist layer through a one-step exposure process and form the desired diffusive direct reflector.

2. Description of Related Art

FIG. 1 is a schematic diagram of the profile of a perfect diffusive direct reflector. As shown in FIG. 1, ideally, a perfect diffusive direct reflector has a slope with an angle θ1 on the photoresist layer such that the incident lights r1, r2 can be reflected by the slope in a direction vertical to the lower substrate 10. As such, the reflected lights r1', r2' reaching the human eye is the brightest. Further, the bumps on the slope can increase viewing angle due to the adaptive astigmatistic effect on r1' and r2'. With such a structure, a diffusive direct reflector can meet the display requirements of separating reflective image and surface glare and increasing viewing angle. For meeting the requirements, a two-step exposure process is used as shown in FIG. 2. In FIG. 2, the first-step exposure process produces the slope with the angle θ1 while the second-step exposure process smoothes the slope produced by the first-step exposure process to control the astigmatistic angle. As shown in FIG. 2, for producing a slant structure in the first-step exposure process, a chromium film photomask as shown in FIG. 3 is used to operate multiple exposures on the photoresist layer. Such a photomask as shown in FIG. 3 must have multiple strip patterns with equal widths and have equal pitches between the strips. In practice, each exposure must shift the photomask a finite distance and produce the slant structure 21 according to increasing or decreasing exposure energy. The increasing or decreasing exposure energy can produce different exposure depth on the photoresist. The finite distance can not only retain previous major exposure depth but also produce an appropriate overlapping area 22 with different exposure depths due to two successive exposures. As such, the slant is formed. At this step, the resulting slant is a ladder profile that cannot control the required astigmatistic angle. In order to control the required astigmatistic angle, using the second-step exposure process forms a smooth profile 23 on each ladder 21 of the slant surface. In the second-step exposure process, any photomask pattern such as circle, triangle, and so on, able to produce 10–30 degrees astigmatistic angle can be used to form a desired slant. However, the complicated exposure procedures take time and cost and may further influence the resulting reflector's quality. For example, when the required slant is formed closer to a perfect reflector as shown in FIG. 1, the exposure frequency increases in the first-step exposure process and the smoothing profile processing control becomes harder in the second-step exposure process. On the other hand, the lower exposure frequency causes reduced precision and further reduces light efficiency so that the resulting reflector has poor quality.

SUMMARY OF THE INVENTION

Accordingly, an object of the invention is to provide a method of manufacturing a diffusive direct reflector using Gray tone exposure, which uses a controllable transmittance photomask to produce the desired slant by a one-step exposure process, thereby simplifying processing, increasing field and saving cost.

Another object of the invention is to provide a method of manufacturing a diffusive direct reflector using Gray tone exposure, which uses a controllable transmittance photomask to form the desired slant and bump by a one-step exposure process so as to control the reflective angle and astigmatistic range of an incident light, thereby increasing the exposure processing productivity.

The method of manufacturing a diffusive direct reflector using Gray tone exposure, comprising the steps: performing the exposure and development processes on a photoresist layer over a substrate using a controllable transmittance photomask pattern. As such, a gradually changing transmittance is obtained by one-step exposure using the photomask pattern and the desired slant is formed. Further, bumps with astigmatistic mechanism can be arranged into the photomask pattern to produce the desired structure with slants and bumps on the photoresist layer at one-step exposure.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 9 is a relationship diagram of energy intensity with respective to exposure depth of FIG. 8 according to the invention;

FIG. 11 is a flowchart of the processes of manufacturing a diffusive direct reflector according to the invention.

DETAILED DESCRIPTION OF THE INVENTION

Figure 1:
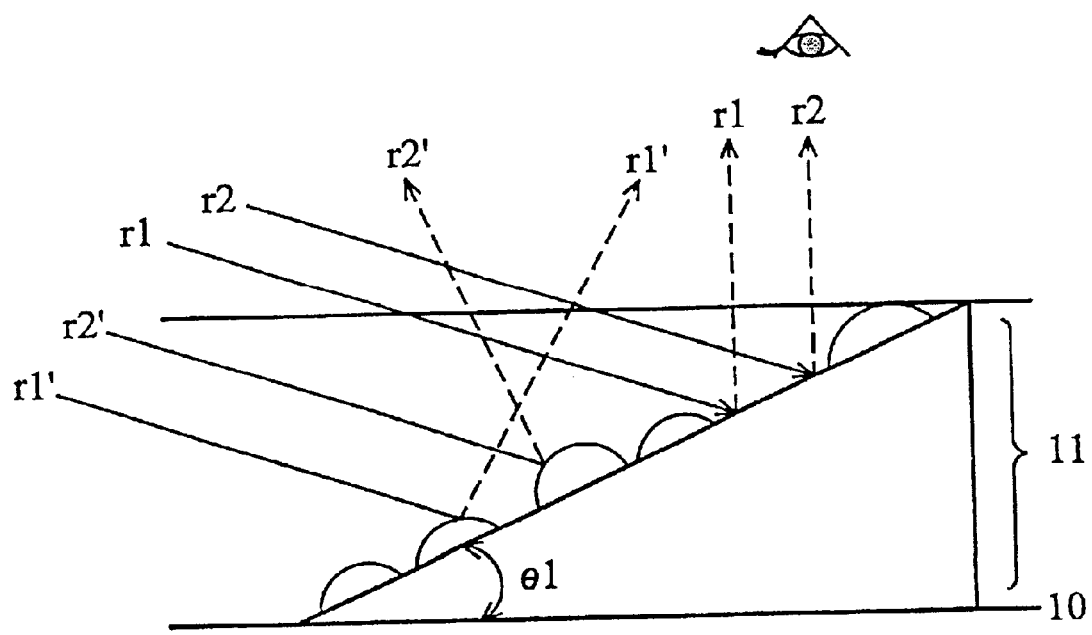
FIG. 1 is a schematic diagram of the profile of a perfect diffusive direct reflector.
Figure 2:
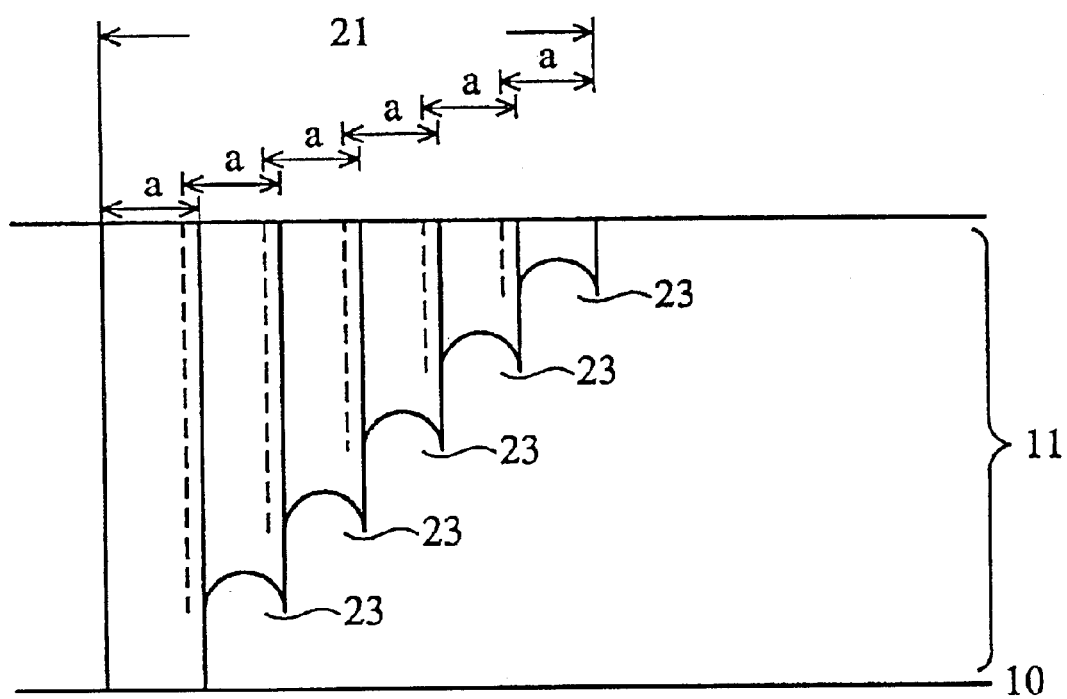
FIG. 2 is a schematic diagram of a typical diffusive direct reflector produced by two-step exposure process.
Figure 3:
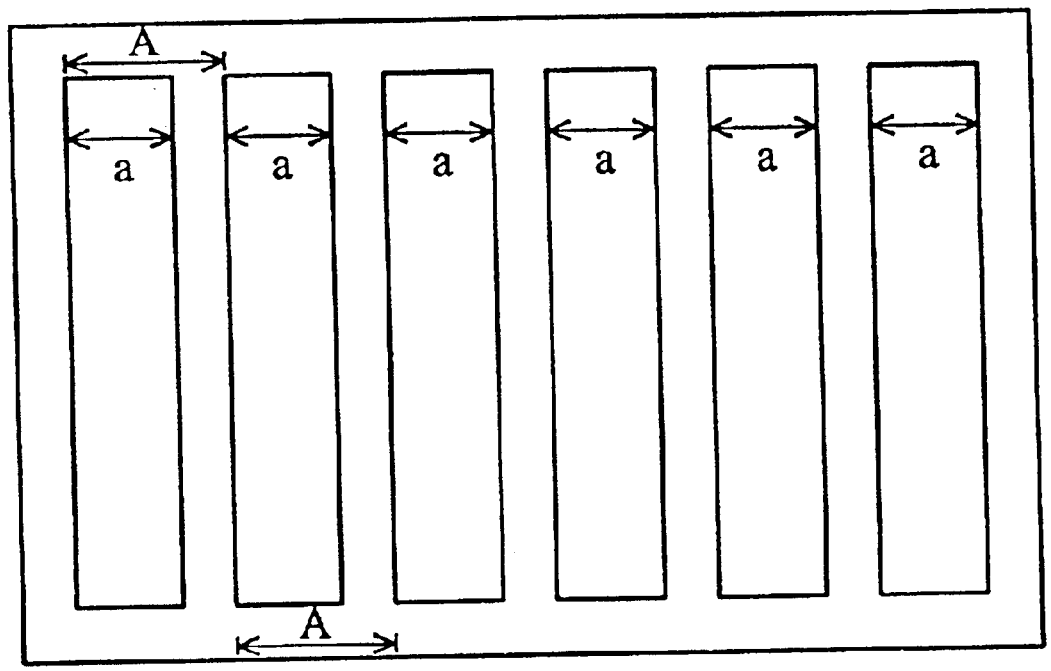
FIG. 3 is a graph of a photomask used in FIG. 2.

The following similar function elements are denoted by the same reference numerals.

Generally speaking, the diffusive direct reflector's processes are the same as that of prior art, including formation of a photoresist layer on a substrate, which can be metal, glass, plastic, ceramic, silicon wafer or any other suitable substrate. The photoresist layer is exposed to ultraviolet radiation over a photomask. A slanting photoresist layer is formed by a developer spun onto the photoresist layer in order to finish development. The slanting photoresist layer is baked and coated with a metal layer with high reflectivity over the slanting photoresist layer to complete the desired diffusive direct reflector. However, the photomask as cited above is a controllable transmittance photomask according to the invention. With the controllable transmittance photomask, only a one-step exposure process, unlike two or more-step exposure processes in the prior art, is needed.

Figure 4:
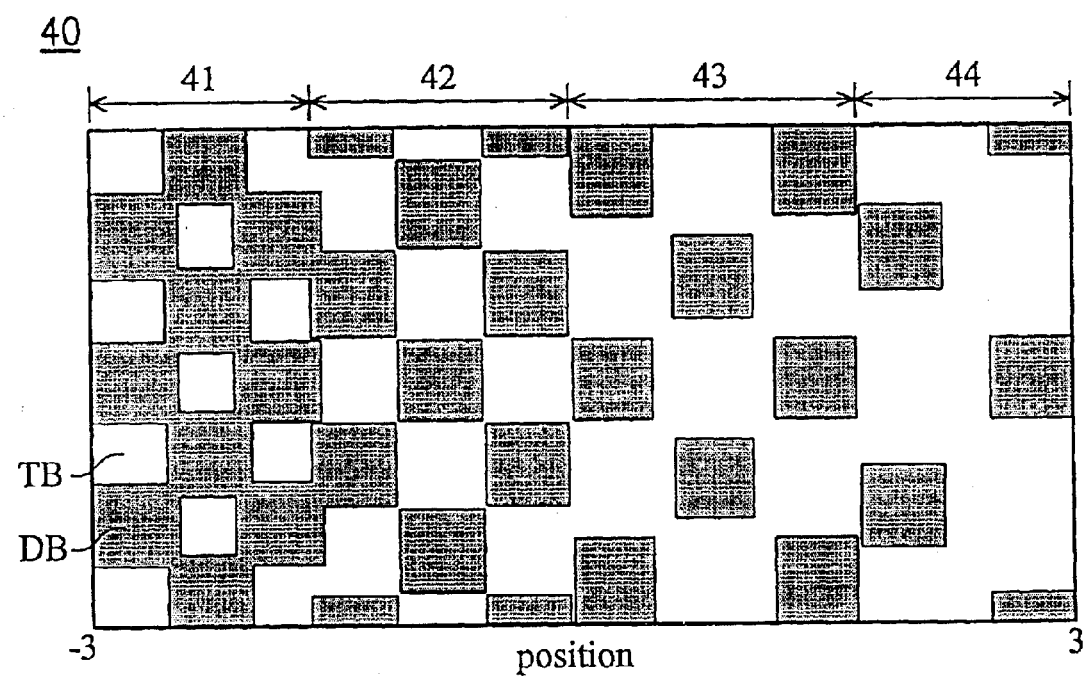
FIG. 4 illustrates an embodiment of controllable transmittance photomask pattern according to the invention.
Figure 5:
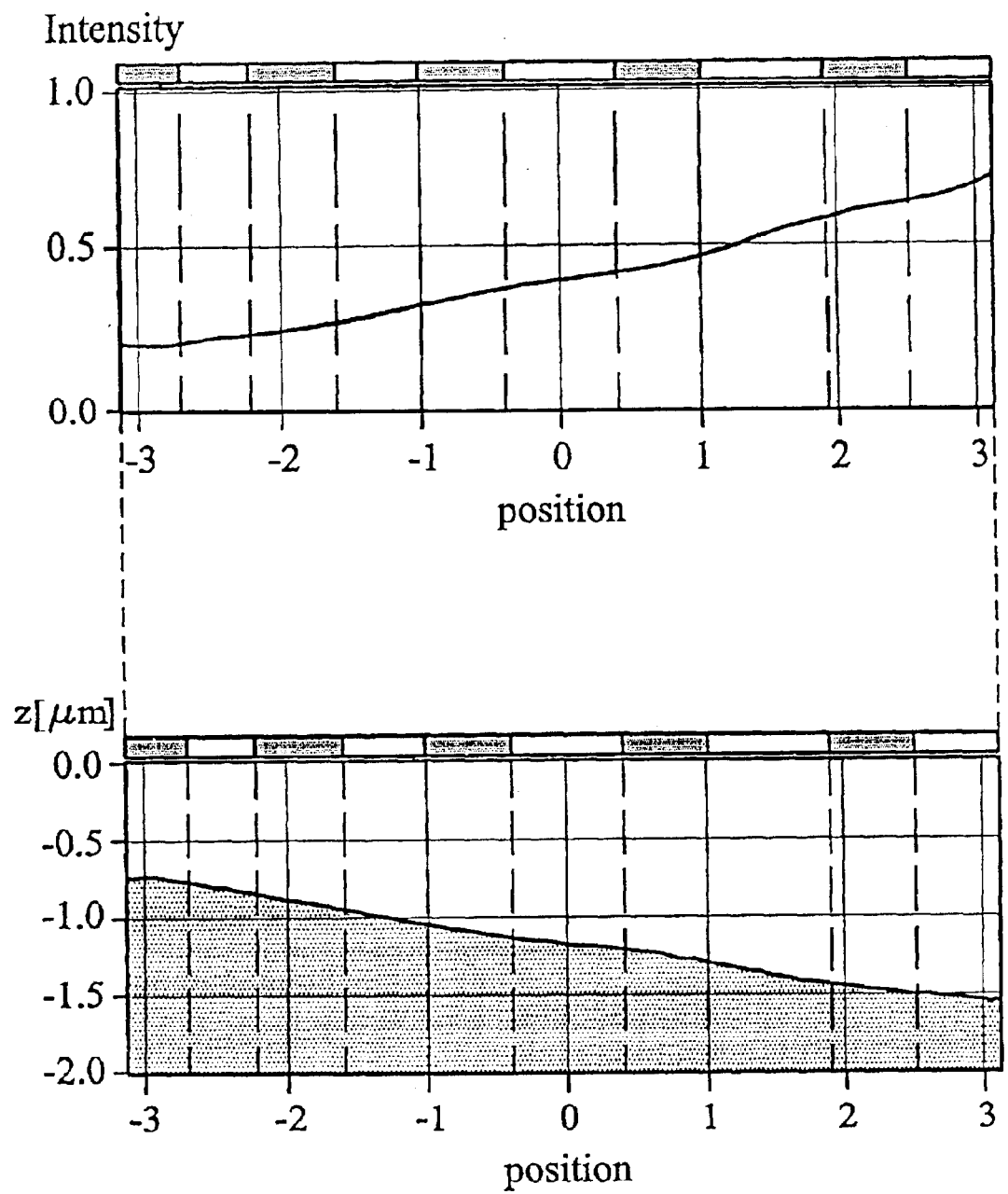
FIG. 5 is a relationship diagram of energy intensity with respective to exposure depth of FIG. 4 according to the invention.
Figure 6:
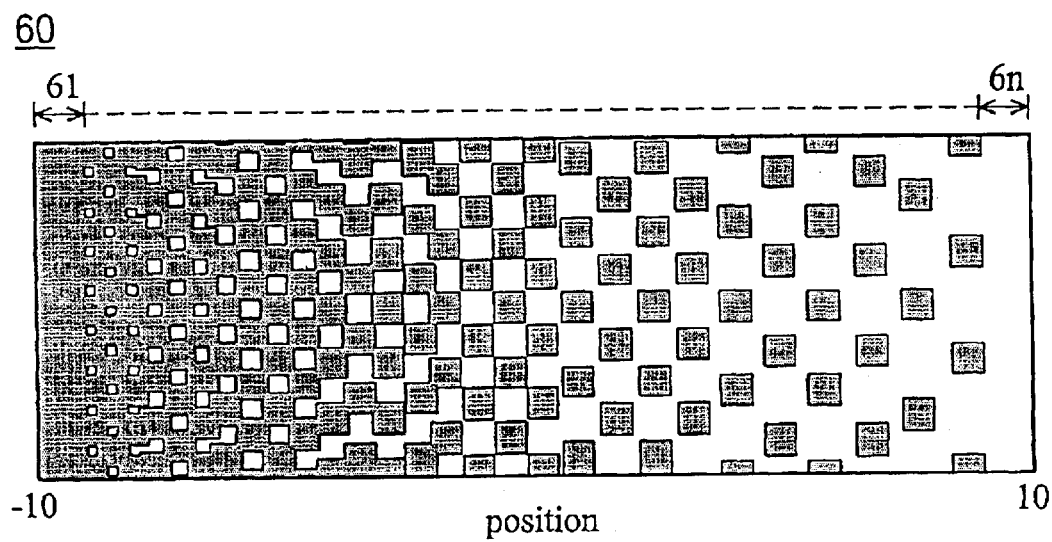
FIG. 6 illustrates another embodiment of controllable transmittance photomask pattern according to the invention.
Figure 7:
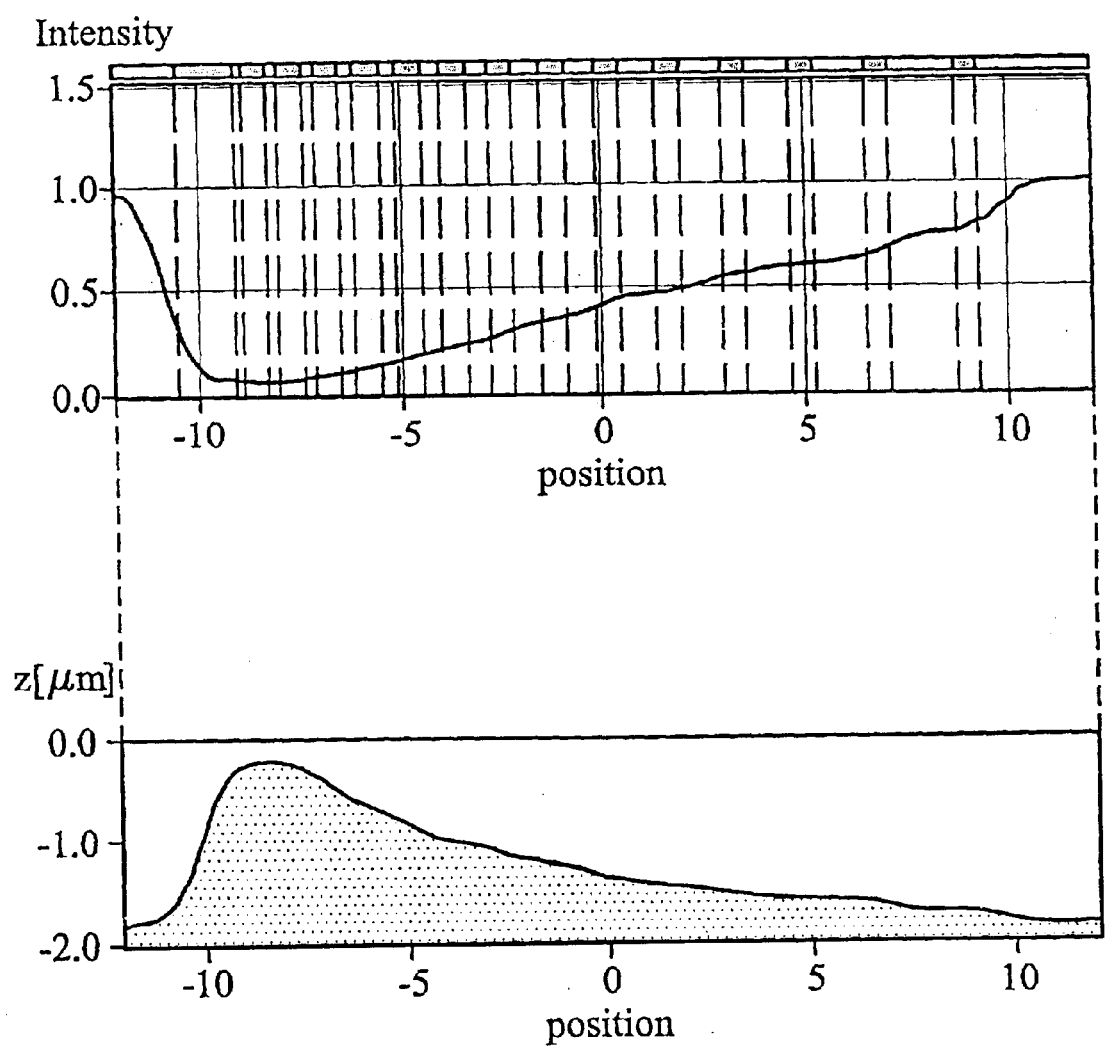
FIG. 7 is a relationship diagram of energy intensity with respective to exposure depth of FIG. 6 according to the invention.

FIG. 4 illustrates an embodiment of controllable transmittance photomask pattern according to the invention. In FIG. 4, the photomask pattern is roughly divided into 4 areas with gradually changing transmittance. Transmittance means average transmittance hereinafter. To produce the controllable transmittance photomask, combinations of micro transparent blocks TB and micro dark blocks DB are used to generate the desired successive transmittance change from low to high or from high to low. Such an arrangement, no matter in regular or irregular combinations of blocks TB and DB, must comply with the feature of successive transmittance change. For the purpose of simple description, regular pattern arrangement on the controllable transmittance photomask is first discussed. As shown in FIG. 4, the pattern of photomask 40 is interlaced with blocks TB and DB from high density to low density. According to the areas of blocks DB occupied on the photomask 40, the photomask 40 is divided into a first region 41, a second region 42, a third region 43 and a fourth region 44. In the first region 41, blocks DB occupy the area than any other region. In the second region 42, blocks DB occupy an area smaller than the first region. In the third region 43, blocks DB occupy an area smaller than the second region 42. In the fourth region 44, blocks DB occupy the least area. As such, the transmittance is gradually changed from low to high with respect to regions 1–4. Due to the different transmittance on different regions, the distribution of exposure intensity presents gradually changing on different positions of the substrate at the same exposure time. Thus, sensitive photoresist has different dissolvent rates on different positions under the same development conditions, and a profile with successively changing height is formed. In other words, transmittance presents a positive proportion for a ratio of micro transparent area to total area of the photomask. As shown in FIG. 5, after ultraviolet rays irradiate the cited regions with the light intensity shown as an ascending curve in the upper figure, a resulting exposure depth acting on the photoresist layer is a descending curve approximately linear, as shown in the lower figure. Because the mask pattern is formed by a positive type photoresist, the resulting profile presents the descending curve. On the other hand, when a negative type photoresist is used, an ascending curve approximating slant profile shown in FIG. 1 is obtained. In practice, the positive type photoresist is preferred. Also, the present embodiment is not limited to four regions or any transmittance range. For example, as shown in FIG. 6, the transmittance from 0 at position −10 to 100% at position 10 is divided into many different transmittance regions such as 61–6n, in order to produce the desired intensity curve. Thereafter, using an energy, for example 170 mJ, performs the exposure, as shown in the upper part of FIG. 7, and using a developer containing, for example, 0.4% Tetramethy lammonium Hydroxide (TMAH), performs the development in spinning or puddling form, as shown in the lower part of FIG. 7.

Figure 8:
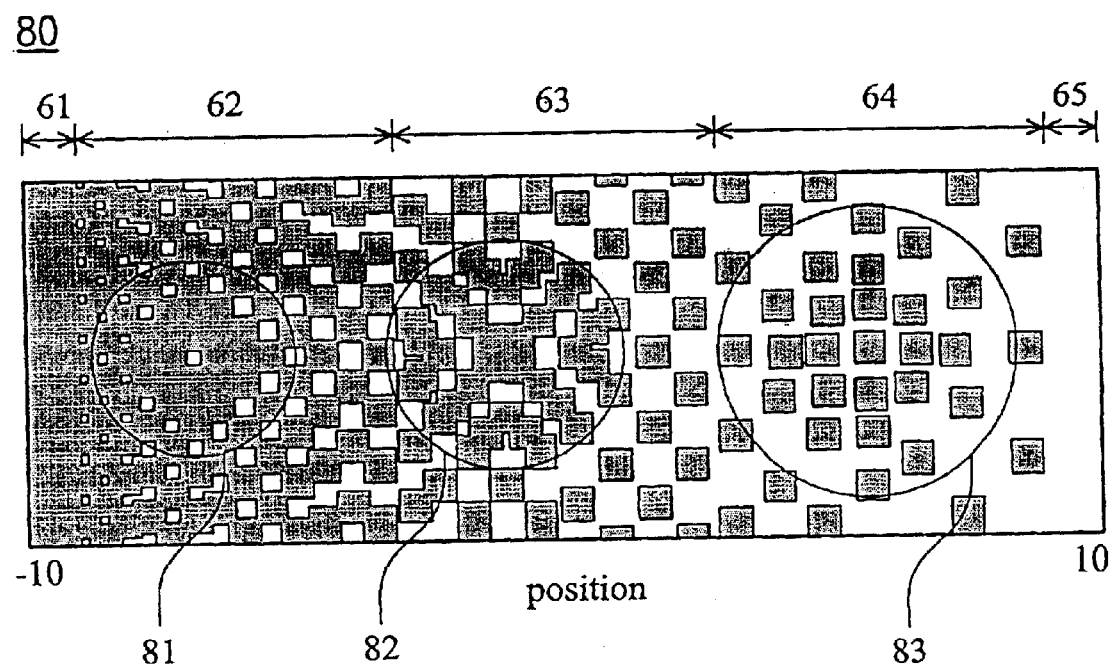
FIG. 8 illustrates another embodiment of controllable transmittance photomask pattern according to the invention.
Figure 7:
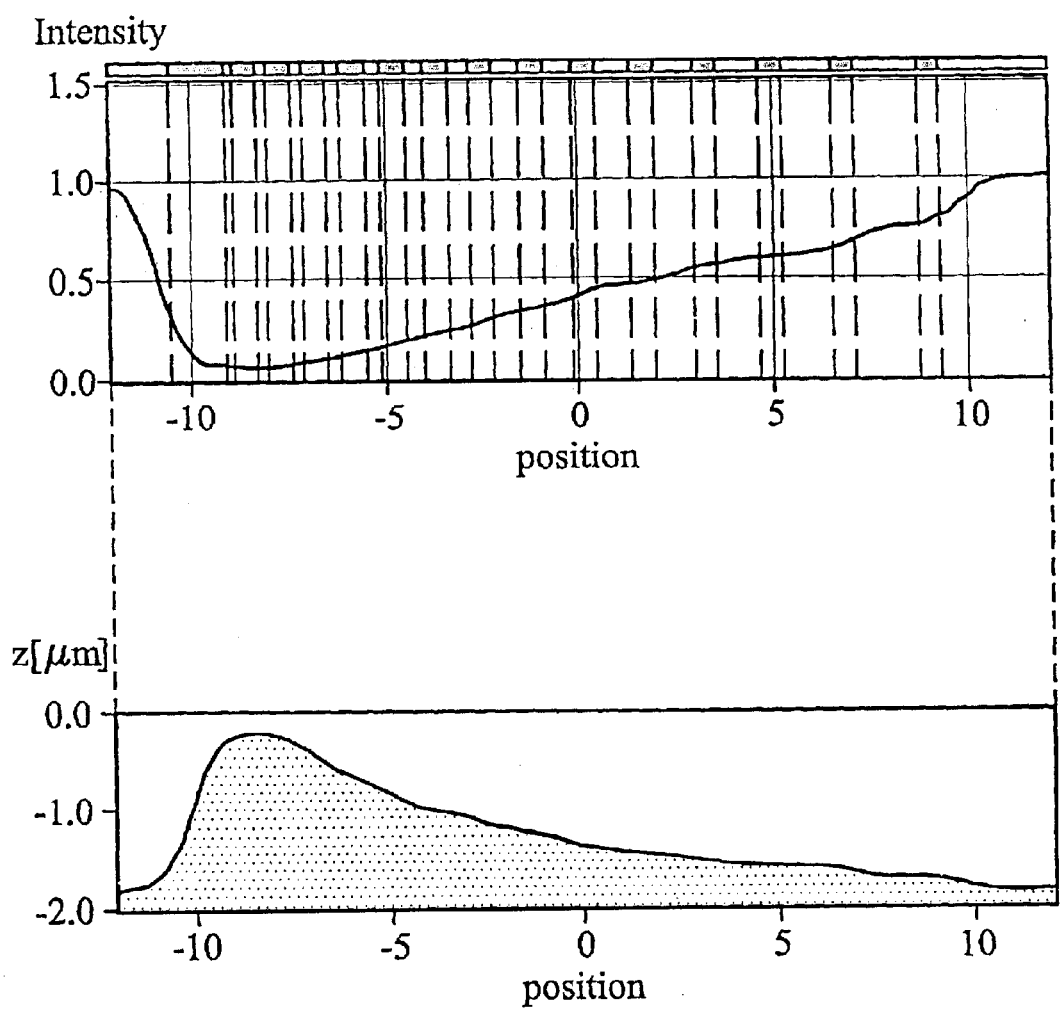

Additionally, other functional structures can be integrated into the pattern to form on the slant and can increase viewing angle. Thus, the productivity of the exposure procedure is increased. For example, as shown in FIG. 8, bumps 81–83 of astigmatism are added in order to generate the exposure curve shown in the upper part of FIG. 9 and the photoresist profile shown in the lower part of FIG. 9. As such, one-step exposure can concurrently control the desired ranges of reflection and astigmatism, and increase light efficiency and viewing angle on the reflective face. Regardless of the number and the position of implementation of bumps, these can be changed as needed. However, a space between bumps is necessary and the arranged densities of bumps and slants are the same in order to obtain the same transmittance from high to low or from low to high.

Figure 10:
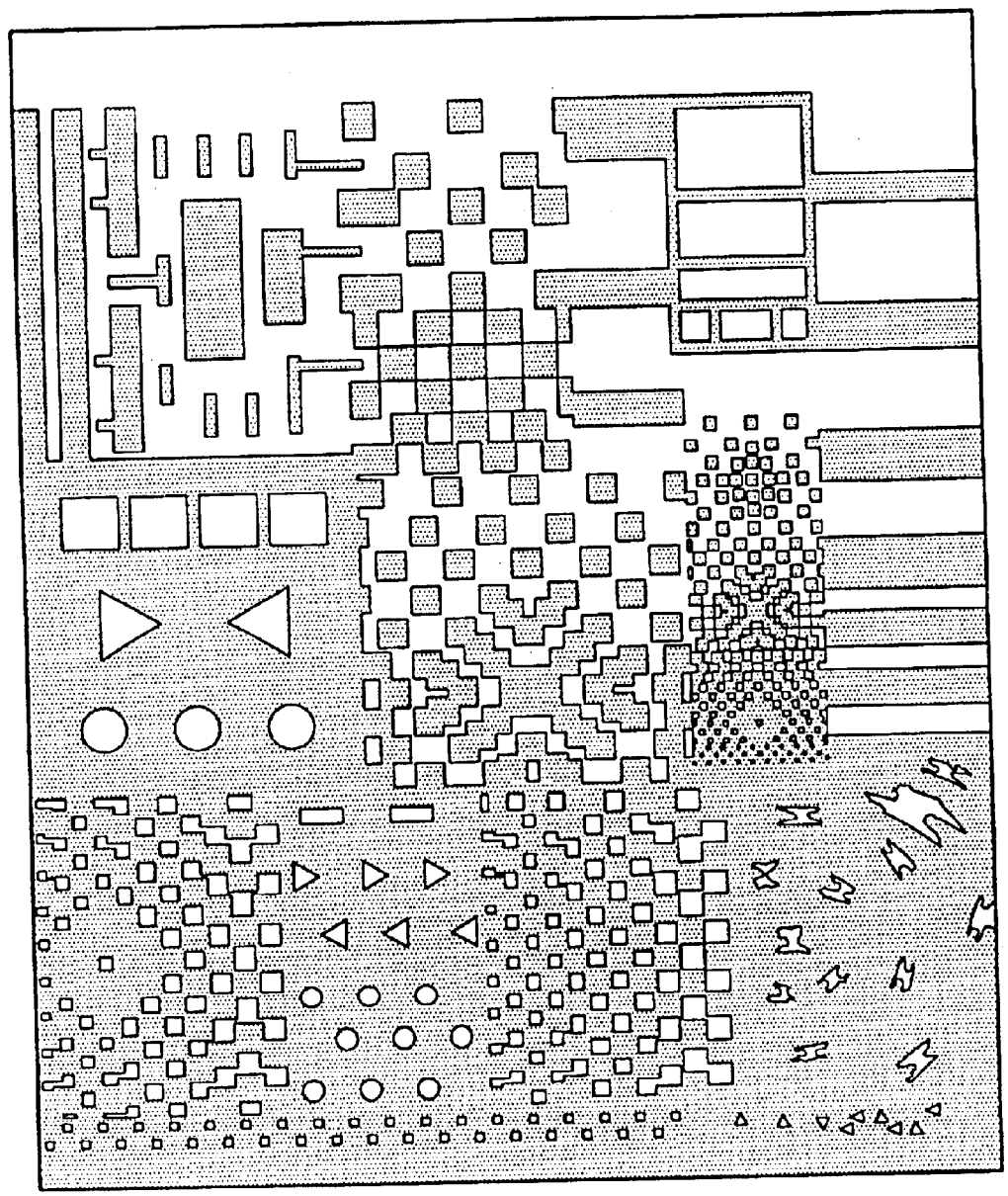
FIG. 10 illustrates a further embodiment of controllable transmittance photomask pattern according to the invention.

Moreover, as shown in FIG. 10, the cited photomask pattern can be an irregular design, not limited to the regular arrangement of FIGS. 4 and 6. The irregularity can combine units of the above-mentioned pattern, circles, strips, triangles and any other patterns. However, no matter what irregular pattern's design has to comply with the spirit of the successively changing transmittance on a photomask.

To summarize, the invention provides a photomask to form a diffusive direct reflector, which uses Gray tone exposure process (S2) to form a photomask pattern on a photoresist layer after the photoresist layer is formed on a substrate (S1). The photomask pattern is divided into a plurality of regions according to the transmittance and each region has a plurality of micro transparent blocks and micro dark blocks such that the ratio of the plurality of micro transparent blocks' area to the total area of respective region presents a feature of gradual changing. The feature of gradual changing represents a transmittance profile changing among regions. The transmittance profile changing generally presents a successively ascending or descending change. Accordingly, the desired slant and bump structure is produced in the photoresist of the diffusive direct reflector by controlling the photomask transmittance curve. The desired photomask pattern is applied on the photoresist layer to perform the exposure (S2) and development (S3) procedures. After the development procedure, a bake procedure (S4), which includes soft baking at 100–150° C. for 5–30 minutes and hard baking at above 200° C. for over one hour, is performed on the photoresist layer in order to solidify the photoresist. Preferably, a metal layer with high reflectivity can be formed on the photoresist (S4) to increase light reflection. Thus, the desired diffusive direct reflector is finished. The metal with high reflectivity can be, for example, silver, aluminum or any other metal with high reflectivity. Further, the finished diffusive direct reflector can be a motherboard to form a die for duplication in order to form a thin film with a structure identical to the desired diffusive direct reflector. As such, repeatable duplication of the desired diffusive direct reflector can be carried out using the thin film over a quartz or glass substrate. Such a fabricating scheme can get rid of the fabricating procedures mentioned above and save much cost.

Although the present invention has been described in its preferred embodiment, it is not intended to limit the invention to the precise embodiment disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A process of manufacturing a diffusive direct reflector by Gray tone exposure, characterized by use of a controllable transmittance photomask on which a photomask pattern is formed for Gray tone exposure, the photomask pattern vertically divided into a plurality of regions each having a plurality of micro transparent blocks and a plurality of micro dark blocks, so that a ratio of the plurality of micro transparent blocks's area to the total area of respective region has a feature of gradual change, so as to form a transmittance profile for controlling the transmittance profile and producing a desired structure on the diffusive direct reflector.

2. The process of claim 1, wherein the photomask pattern is a pattern with regular arrangement.

3. The process of claim 1, wherein the photomask pattern is patterns with regular arrangement.

4. The process of claim 1, wherein the photomask pattern is patterns with irregular arrangement.

5. The process of claim 1, wherein the transmittance profile has a gradually descending change.

6. The process of claim 1, wherein the transmittance profile has a gradually ascending change.

7. The process of claim 1, wherein the desired structure is a slant structure.

8. The process of claim 1, wherein the desired structure is a bump structure.

9. The process of claim 1, wherein the desired structure is a slant and bump structure.

10. A process of manufacturing a diffusive direct reflector by Gray tone exposure, comprising the steps of:

forming a photoresist layer on a substrate;

preparing a controllable transmittance photomask on which a photomask pattern is formed for Gray tone exposure, the photomask pattern vertically divided into a plurality of regions, each having a plurality of micro transparent blocks and a plurality of micro dark blocks, so that a ratio of the plurality of micro transparent blocks's area to the total area of respective region has a feature of gradual change, to form a transmittance profile for controlling the transmittance profile;

exposing and developing the photoresist layer over the controllable transmittance to produce a desired structure on the photoresist layer;

baking the photoresist layer with the desired structure; and coating a metal layer with high reflectivity over the photoresist layer after the baking step, to produce the diffusive direct reflector.

11. The process of claim 10, further comprising the steps of using the diffusive direct reflector as a motherboard to form a die; using the die in duplication to form a thin film with a structure identical to the diffusive direct reflector; and using the thin film over a substrate selected from the group consisting of glass and quartz to produce the diffusive direct reflector.

12. The process of claim 10, wherein the substrate comprises a glass-based material.

13. The process of claim 10, wherein the substrate comprises a quartz-based material.

14. The process of claim 10, wherein the substrate comprises a ceramic-based material.

15. The process of claim 10, wherein the substrate comprises a plastic-based material.

16. The process of claim 10, wherein the substrate comprises a silicon wafer material.

17. The process of claim 10, wherein the photoresist layer is a positive type photoresist layer.

18. The process of claim 10, wherein the photoresist layer is a negative type photoresist layer.

19. The process of claim 10, wherein the photomask pattern is a pattern with regular arrangement.

20. The process of claim 10, wherein the photomask pattern is patterns with regular arrangement.

21. The process of claim 10, wherein the photomask pattern is patterns with irregular arrangement.

22. The process of claim 10, wherein the transmittance profile has a gradually descending change.

23. The process of claim 10, wherein the transmittance profile has a gradually ascending change.

24. The process of claim 10, wherein the desired structure is a slant structure.

25. The process of claim 10, wherein the desired structure is a bump structure.

26. The process of claim 10, wherein the desired structure is a slant and bump structure.

27. The process of claim 10, wherein the exposing and developing step performs the exposure procedure at an energy range of 50 to 500 mJ.

28. The process of claim 10, wherein the exposing and developing step performs the developing procedure by spinning a developer containing 0.3 to 3.0% TMAH onto the photoresist layer.

29. The process of claim 10, wherein the exposing and developing step performs the developing procedure by puddling a developer containing 0.3 to 3.0% TMAH onto the photoresist layer.

30. The process of claim 10, wherein the baking step includes soft bake at 100 to 150° C. for 5 to 30 minutes and hard bake at above 200° C. for over one hour.

31. The process of claim 10, wherein the metal layer with high reflectivity is selected from the group consisting of silver or aluminum.

* * * * *